(12) United States Patent
Zhuo et al.

(10) Patent No.: US 12,489,079 B2
(45) Date of Patent: Dec. 2, 2025

(54) PACKAGING STRUCTURE AND PACKAGING METHOD OF HIGH-POWER RADIO FREQUENCY DEVICE

(71) Applicant: INNOGRATION (SUZHOU) CO., LTD., Suzhou (CN)

(72) Inventors: Yinghao Zhuo, Suzhou (CN); Zhimin Xiao, Suzhou (CN); Lei Zhu, Suzhou (CN)

(73) Assignee: INNOGRATION (SUZHOU) CO., LTD., Suzhou (CN)

( * ) Notice: Subject to any disclaimer, the term of this patent is extended or adjusted under 35 U.S.C. 154(b) by 424 days.

(21) Appl. No.: 18/017,415

(22) PCT Filed: Jun. 9, 2021

(86) PCT No.: PCT/CN2021/099039
§ 371 (c)(1),
(2) Date: Jan. 23, 2023

(87) PCT Pub. No.: WO2022/017034
PCT Pub. Date: Jan. 27, 2022

(65) Prior Publication Data
US 2023/0282609 A1    Sep. 7, 2023

(30) Foreign Application Priority Data
Jul. 22, 2020  (CN) .......................... 202010711078.X

(51) Int. Cl.
*H01L 23/66* (2006.01)
*H01L 23/00* (2006.01)
*H01L 25/07* (2006.01)

(52) U.S. Cl.
CPC .............. *H01L 24/48* (2013.01); *H01L 23/66* (2013.01); *H01L 25/072* (2013.01); *H01L 24/49* (2013.01);
(Continued)

(58) Field of Classification Search
CPC ....... H01L 24/48; H01L 23/66; H01L 25/072; H01L 24/49; H01L 2224/48011;
(Continued)

(56) References Cited

U.S. PATENT DOCUMENTS

| 2011/0024919 A1 | 2/2011 | Kang et al. |
| 2020/0075463 A1* | 3/2020 | Sanchez ............ H01L 23/49503 |

FOREIGN PATENT DOCUMENTS

| CN | 101556927 A | 10/2009 |
| CN | 102623416 A | 8/2012 |

(Continued)

OTHER PUBLICATIONS

ISR of PCT/CN2021/099039.

*Primary Examiner* — Elias Ullah
(74) *Attorney, Agent, or Firm* — Zhigang Ma

(57) ABSTRACT

The present invention discloses a packaging structure of a high-power radio frequency device, comprising a plurality of radio frequency power chips connected in parallel and a packaging flange; and the plurality of radio frequency power chips are arranged obliquely in a packaging cavity of the packaging flange, to reduce the number of input bond-wires of the radio frequency power chips, so that the input bond-wires and output bond-wires are not overlapped in space. The plurality of chips are arranged obliquely on the packaging flange, which significantly improves the utilization rate of packaging space and achieves the purpose of high-power output.

10 Claims, 5 Drawing Sheets

(52) U.S. Cl.
CPC .............. *H01L 2224/48011* (2013.01); *H01L 2224/48157* (2013.01); *H01L 2224/4911* (2013.01)

(58) Field of Classification Search
CPC ... H01L 2224/48157; H01L 2224/4911; H01L 25/0655; H01L 2223/6644; H01L 2223/6611; H01L 2224/48091; H01L 21/50; H01L 21/56; H01L 23/31; H01L 23/48; H01L 23/495; H01L 25/18; H01L 23/3121; H01L 23/4951; H01L 23/49575
See application file for complete search history.

(56) References Cited

FOREIGN PATENT DOCUMENTS

| | | |
|---|---|---|
| CN | 109616451 A | 4/2019 |
| JP | 2001135671 A | 5/2001 |

* cited by examiner

PACKAGING STRUCTURE AND PACKAGING METHOD OF HIGH-POWER RADIO FREQUENCY DEVICE

TECHNICAL FIELD

The present invention relates to the technical field of packaging of radio frequency devices, in particular to a packaging structure and a packaging method of a high-power radio frequency device.

BACKGROUND

Mainstream radio frequency power chips usually consider factors such as product performance and heat dissipation, and chip size is mostly rectangular, and has a large aspect ratio. Limited by the production and assembly technologies, a single chip may not be made large. When the output power of a single chip cannot meet the requirements, generally, a plurality of chips are connected in parallel and assembled in the same package. The internal chip layout structure of the current mainstream high-power radio frequency power amplifier is shown in FIG. 1. As shown in FIG. 2, a plurality of chips 1 are assembled in parallel in the same package 4; the chips 1 and a packaging cavity 5 are parallel; the plurality of chips 1 are welded side by side on a packaging flange 6; the direction of bond-wires of the chips 1 is perpendicular to the direction of bond pads of the chips; and the other ends of input bond-wires 3 and output bond-wires 2 are welded to a pin 7. The input bond-wires 3 and the output bond-wires 2 may not span over the chips 1, and the input bond-wires 3 and the output bond-wires 2 may not be overlapped in space. However, limited by the chip size and the internal cavity size of a package, the purpose of high-power output cannot be achieved.

SUMMARY

In view of the above technical problems, the purpose of the present invention is to provide a packaging structure and a packaging method of a high-power radio frequency device. A plurality of chips are arranged obliquely on a packaging flange, which significantly improves the utilization rate of packaging space and achieves the purpose of high-power output.

To solve the problems in the prior art, the present invention provides the following technical solution:

A packaging structure of a high-power radio frequency device comprises a plurality of radio frequency power chips connected in parallel and a packaging flange; and the plurality of radio frequency power chips are arranged obliquely in a packaging cavity of the packaging flange, to reduce the number of input bond-wires of the radio frequency power chips, so that the input bond-wires and output bond-wires are not overlapped in space.

In a preferred technical solution, the plurality of radio frequency power chips form a certain angle with the packaging cavity, and the plurality of radio frequency power chips are arranged in parallel at the same angle.

In a preferred technical solution, a spacing between the outermost end of the radio frequency power chips and the packaging cavity is greater than or equal to a set threshold.

In a preferred technical solution, the number of the input bond-wires of the radio frequency power chip in the middle is reduced; and the reduced number of the input bond-wires is calculated and determined according to the positions of the output bond-wires of adjacent chips and the spacing between the input bond-wires of the radio frequency power chip in the middle.

In a preferred technical solution, the lengths of the input bond-wires and the output bond-wires are determined according to a distance between the position of a bond pad of each radio frequency power chip and the position of a bond pad of a connecting end.

The present invention further discloses a packaging method of a high-power radio frequency device, comprising the following steps:

S01: determining an inclined angle between the radio frequency power chip and the packaging cavity according to that the spacing between the outermost end of the radio frequency power chips and the packaging cavity is greater than or equal to the set threshold;

S02: mounting the plurality of radio frequency power chips in the packaging cavity according to the determined inclined angle;

S03: determining the lengths of the input bond-wires and the output bond-wires according to the distance between the position of the bond pad of each radio frequency power chip and the position of the bond pad of the connecting end, and conducting wiring;

S04: reducing the number of the input bond-wires of the radio frequency power chips so that the input bond-wires and the output bond-wires are not overlapped in space.

In a preferred technical solution, the inclined angle in step S02 is determined by the following method:

sucking up the radio frequency power chips with a suction nozzle so that the packaging cavity and the radio frequency power chips are centered up and down; taking a center point of the packaging flange as a center of a circle to rotate a packaging carrier so that the packaging flange rotates with the carrier, with a rotation angle being the determined inclined angle; and fixing the position of the packaging carrier.

In a preferred technical solution, step S02 further comprises calculating a horizontal spacing between the radio frequency power chips and mounting the plurality of radio frequency power chips according to the determined horizontal spacing.

In a preferred technical solution, in step S04, the number of the input bond-wires of the radio frequency power chip in the middle is reduced; and the reduced number of the input bond-wires is calculated and determined according to the positions of the output bond-wires of adjacent chips and the spacing between the input bond-wires of the radio frequency power chip in the middle.

Compared with the solution of the prior art, the present invention has the advantages that:

1. The plurality of chips are arranged obliquely on the packaging flange, which significantly improves the utilization rate of packaging space and achieves the purpose of high-power output. The present invention avoids the problem that the bond-wires directly span over the adjacent chips by rotating the chips. By slightly reducing the number of the input bond-wires of the radio frequency power chip in the middle, the output bond-wires may not be reduced, which can ensure the reliability of the high-power application process, avoid the large-area overlapping of the input bond-wires and the output bond-wires in space, reduce mutual inductance and effectively avoid the shaking of the radio frequency power device.

2. Chip welding and bond-wire bonding technologies involved in the present invention are mature technologies without requiring redevelopment and revalidation, and mass production can be quickly realized. The problems of redesign, repackaging and chip size are avoided, and the cost and the product development cycle are greatly reduced. Customers can quickly realize compatible replacement.

DESCRIPTION OF DRAWINGS

The present invention will be further described below in combination with the drawings and the embodiments.

DETAILED DESCRIPTION

The above solutions will be further described below in combination with specific embodiments. It should be understood that the embodiments are only used for illustrating the present invention, not used for limiting the scope of the present invention. Implementation conditions adopted in the embodiments can be further adjusted according to the conditions of specific manufacturers. Implementation conditions not marked are generally conditions in routine experiments.

Embodiment

Figure 1:
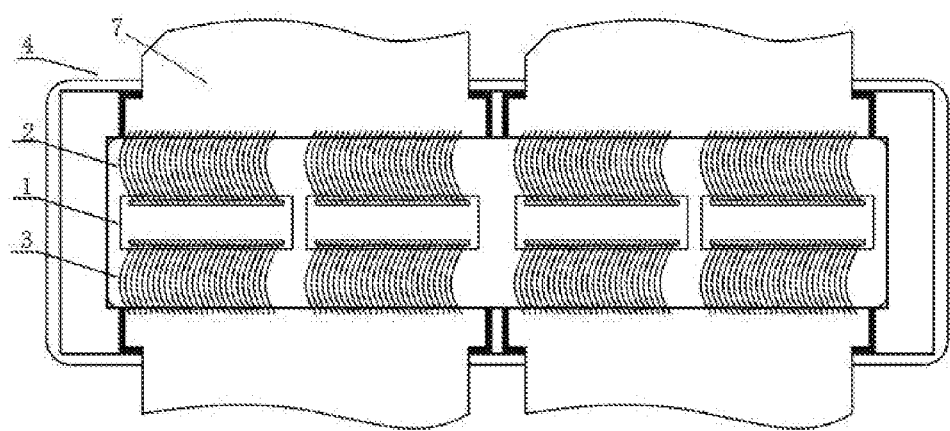
FIG. 1 is a schematic diagram of an internal chip layout and bond-wires of the existing high-power radio frequency power device.
Figure 2:
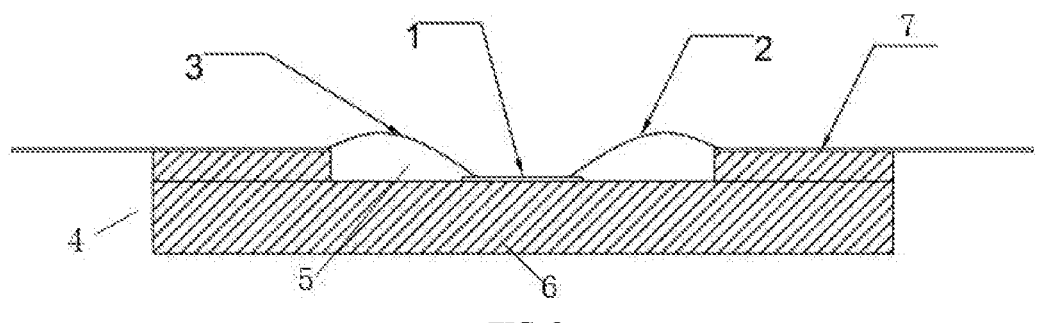
FIG. 2 is a side view of FIG. 1.
Figure 3:
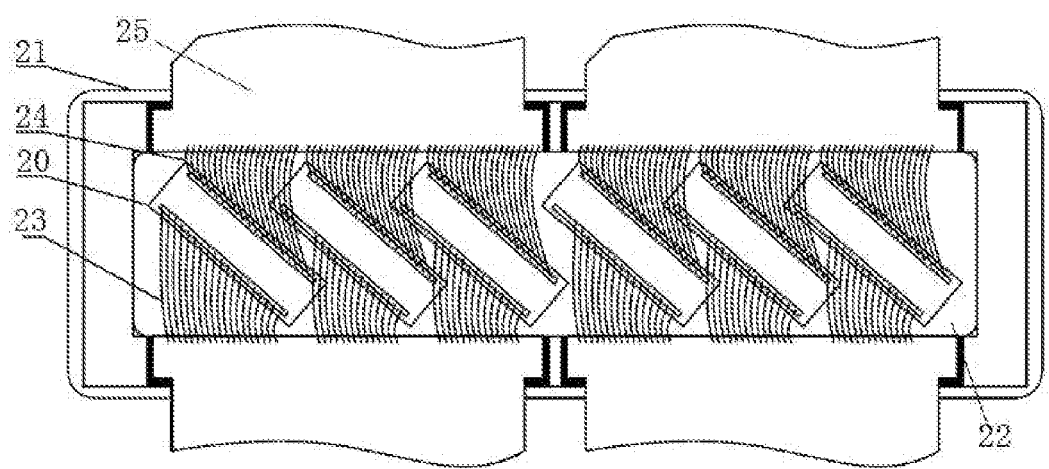
FIG. 3 is a schematic diagram of an internal chip layout and chips of a radio frequency power device in an example of the present invention.
Figure 4:
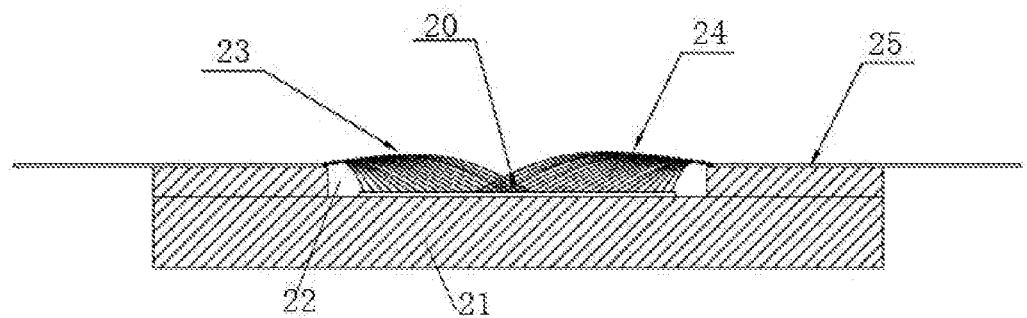
FIG. 4 is a side view of FIG. 3.

As shown in FIGS. 3 and 4, a packaging structure of a high-power radio frequency device in the present invention comprises a plurality of radio frequency power chips 20 connected in parallel and a packaging flange 21; the plurality of radio frequency power chips 20 are arranged obliquely in a packaging cavity 22 of the packaging flange 21; the plurality of radio frequency power chips 20 form a certain angle with the packaging cavity 22; and the plurality of radio frequency power chips 20 are preferably arranged in parallel at the same angle. Subsequent technologies can be simpler. The number of the radio frequency power chips is determined according to the selected packaging size and the selected chip size.

Figure 5:
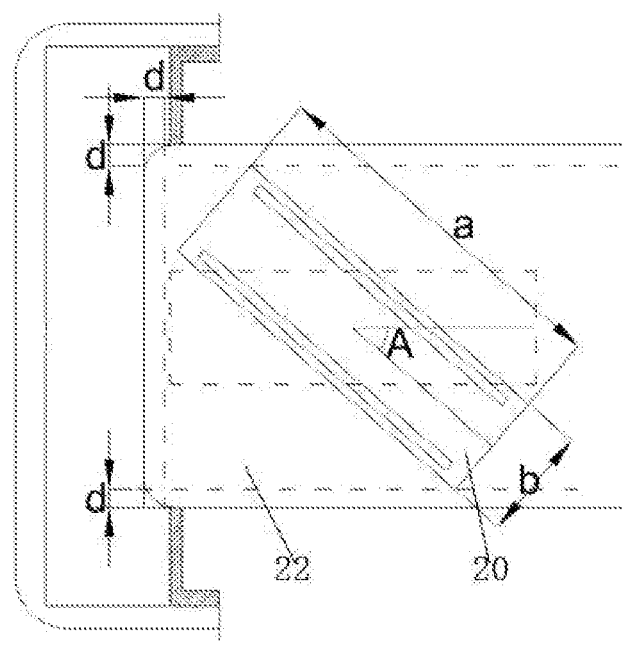
FIG. 5 is a schematic diagram for determining a rotation angle of the present invention.

As shown in FIG. 5, when the inclined angle □A is determined, a spacing between the outermost end of the radio frequency power chips 20 and the packaging cavity 22 is greater than or equal to a set threshold, such as minimum spacing d. Specifically, the maximum inclined angle should not make a distance among an upper left vertex angle of the chip, a lower right vertex angle and the edge of the packaging cavity less than the minimum spacing d.

After the radio frequency power chips 20 are mounted on the packaging flange 21, the bond-wires need to be connected.

In order to reduce mutual inductance and effectively avoid the shaking of the radio frequency power device, the number of input bond-wires 23 of the radio frequency power chips 20 is reduced so that the input bond-wires 23 and output bond-wires 24 are not overlapped in space. Reducing the number of the input bond-wires of the chips can achieve a large number of the output bond-wires, which has a better guarantee for reliability of the high-power application process.

In a preferred embodiment, the number of the input bond-wires of the radio frequency power chip in the middle is reduced, which can further achieve a large number of output bond-wires and provide reliability; and the reduced number of the input bond-wires is calculated and determined according to the positions of the output bond-wires of adjacent chips and the spacing between the input bond-wires of the radio frequency power chip in the middle.

The lengths of the input bond-wires 23 and the output bond-wires 24 are determined according to a distance between the position of a bond pad of each radio frequency power chip and the position of a bond pad of a connecting end.

The connecting end may be a pin 25 with packaging, or may be other electronic elements to be connected without packaging, which is not limited here.

The present invention further discloses a packaging method of a high-power radio frequency device, comprising the following steps:

S01: determining an inclined angle between the radio frequency power chip and the packaging cavity according to that the spacing between the outermost end of the radio frequency power chips and the packaging cavity is greater than or equal to the set threshold;

S02: calculating a horizontal spacing between the radio frequency power chips, mounting the plurality of radio frequency power chips according to the determined horizontal spacing, and mounting the plurality of radio frequency power chips in the packaging cavity according to the determined inclined angle;

S03: determining the lengths of the input bond-wires and the output bond-wires according to the distance between the position of the bond pad of each radio frequency power chip and the position of the bond pad of the connecting end, and conducting wiring;

S04: reducing the number of the input bond-wires of the radio frequency power chips so that the input bond-wires and the output bond-wires are not overlapped in space.

The packaging method is described below in combination with specific examples:

Firstly, appropriate existing ceramic packages and chips are selected according to design needs. The solution in this example selects an existing package, and the cavity size is 27.94 mm*6.96 mm; and one chip size selected (a*b) is 6.15 mm*1.9 mm.

The chips are sucked up with a suction nozzle of a welding device to ensure that the package and the chips are centered up and down. The package here comprises a packaging flange and a pin; a center point of the package is taken as a center of a circle to rotate a packaging carrier so that the package rotates with the carrier; the maximum rotation angle should not make a distance among an upper left vertex angle of the chip, a lower right vertex angle and the edge of the package less than the minimum spacing d; the maximum rotation angle is selected on the premise of ensuring controllability of technological quality; and the position of the packaging carrier is fixed.

A specific welding device is selected according to the gold-bearing characteristic of the chips, and then the chip welding device takes photos to identify the package position. According to the known rotation angle, the package size and the chip size, a relatively reasonable chip step can be calculated and designed, that is, the horizontal spacing between the radio frequency power chips; and then the chip step programming is input into a chip mounter to set a welding program for welding and mounting the plurality of chips. Here, the horizontal spacing between the radio frequency power chips can be calculated according to the formula of trigonometric function.

Then, a welded semi-finished product is further photographed to identify the position of the chip on a wire bonder platform; the bond-wires of different wire lengths are set according to the positions of the bond pads of the chips; and the bond-wires are connected.

The number of the input bond-wires of the radio frequency power chips is reduced so that the input bond-wires and the output bond-wires are not overlapped in space. The reduced number of the input bond-wires is calculated and determined according to the positions of the output bond-wires of adjacent chips and the spacing between the input bond-wires of the radio frequency power chip in the middle.

Finally, a ceramic lid is covered for testing.

If the existing layout solution is adopted, only 4 chips of the selected size can be placed in the package, but 6 chips of the same size can be placed in the same package by using the technical method of the present invention. The utilization rate of packaging space is significantly improved and the purpose of high-power output is achieved.

It should be understood that the above specific embodiments of the present invention are only used to illustrate or explain the principle of the present invention, and do not constitute a limitation to the present invention. Therefore, any modification, equivalent substitution, improvement, etc. made without deviating from the spirit and scope of the present invention shall be included in the protection scope of the present invention. In addition, the attached claims in the present invention are intended to cover all variations and modifications falling within the scope and boundaries of the attached claims, or in equivalent forms of the scope and boundaries.

The invention claimed is:

1. A packaging structure of a radio frequency device, comprising a plurality of radio frequency power chips connected in parallel and a packaging flange, wherein the plurality of radio frequency power chips are arranged obliquely in a packaging cavity of the packaging flange, and the plurality of radio frequency power chips have different arrangements for input bond-wires in manner that the input bond-wires of one or more of the radio frequency power chips are reduced to be less than output bond-wires of the one or more of the radio frequency power chips, and the input bond-wires of another one or more of the radio frequency power chips are not reduced, so that the input bond-wires of all of the plurality of radio frequency power chips and the output bond-wires of all of the plurality of radio frequency power chips are not overlapped in space.

2. The packaging structure of the radio frequency device according to claim 1, wherein the plurality of radio frequency power chips form a certain angle with the packaging cavity, and the plurality of radio frequency power chips are arranged in parallel at the same angle.

3. The packaging structure of the radio frequency device according to claim 2, wherein a spacing between the outermost end of the radio frequency power chips and the packaging cavity is greater than or equal to a set threshold.

4. The packaging structure of the radio frequency device according to claim 1, wherein the number of the input bond-wires of the radio frequency power chip in the middle is reduced; and the reduced number of the input bond-wires is calculated and determined according to the positions of the output bond-wires of adjacent chips and the spacing between the input bond-wires of the radio frequency power chip in the middle.

5. The packaging structure of the radio frequency device according to claim 1, wherein the lengths of the input bond-wires and the output bond-wires are determined according to a distance between the position of a bond pad of each radio frequency power chip and the position of a bond pad of a connecting end.

6. The packaging structure of the radio frequency device according to claim 1, wherein each of the plurality of radio frequency power chips is arranged obliquely in the packaging cavity in a manner that an upper left vertex angle of the radio frequency power chip and a lower right vertex angle of the radio frequency power chip are spaced a same spacing from a corresponding edge of the packaging cavity.

7. A packaging method of a radio frequency device, comprising the following steps:
   S01: determining an inclined angle between the radio frequency power chip and a packaging cavity according to a spacing between an outermost end of the radio frequency power chips and the packaging cavity is greater than or equal to a set threshold;
   S02: mounting a plurality of radio frequency power chips in the packaging cavity according to the determined inclined angle;
   S03: determining lengths of input bond-wires and output bond-wires according to the distance between a position of a bond pad of each radio frequency power chip and a position of a bond pad of a connecting end, and conducting wiring;
   S04: reducing the number of the input bond-wires of one or more of the radio frequency power chips to allow the input bond-wires of the one or more of the radio frequency power chips are less than the output bond-wires of the one or more of the radio frequency power chips, and maintaining the number of the input bond-wires of another one or more of the radio frequency power chips unchanged, so that the input bond-wires of all of the plurality of radio frequency power chips and the output bond-wires of all of the plurality of radio frequency power chips are not overlapped in space.

8. The packaging method of the radio frequency device according to claim 7, wherein the inclined angle in step S02 is determined by the following method:
   sucking up the radio frequency power chips with a suction nozzle so that the packaging cavity and the radio frequency power chips are centered up and down; taking a center point of the packaging flange as a center of a circle to rotate a packaging carrier so that the packaging flange rotates with the carrier, with a rotation angle being the determined inclined angle; and fixing the position of the packaging carrier.

9. The packaging method of the radio frequency device according to claim 6, wherein step S02 further comprises calculating a horizontal spacing between the radio frequency power chips and mounting the plurality of radio frequency power chips according to the determined horizontal spacing.

10. The packaging method of the radio frequency device according to claim 7, wherein in step S04, the number of input bond-wires of the radio frequency power chip in the middle is reduced; and the reduced number of the input bond-wires is calculated and determined according to the positions of the output bond-wires of adjacent chips and the spacing between the input bond-wires of the radio frequency power chip in the middle.

* * * * *